(12) United States Patent
Lee

(10) Patent No.: US 7,616,033 B2
(45) Date of Patent: Nov. 10, 2009

(54) APPARATUS AND METHOD FOR SUPPLYING VOLTAGE IN SEMICONDUCTOR DEVICE

(75) Inventor: Dong-Hyuk Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 55 days.

(21) Appl. No.: 11/521,652

(22) Filed: Sep. 15, 2006

(65) Prior Publication Data

US 2007/0164803 A1 Jul. 19, 2007

(30) Foreign Application Priority Data

Jan. 13, 2006 (KR) .................... 10-2006-0003831

(51) Int. Cl.
*H03L 7/00* (2006.01)
(52) U.S. Cl. .................... 327/143; 327/333; 327/321
(58) Field of Classification Search ......... 327/309–313, 327/321, 333, 142–143, 384
See application file for complete search history.

(56) References Cited

U.S. PATENT DOCUMENTS

| 4,870,555 | A | * | 9/1989 | White | 363/21.06 |
| 6,130,563 | A | * | 10/2000 | Pilling et al. | 327/111 |
| 6,504,783 | B2 | | 1/2003 | Jo | 365/226 |
| 7,075,338 | B2 | * | 7/2006 | Mizuno et al. | 327/66 |
| 2004/0212398 | A1 | * | 10/2004 | Kitazawa et al. | 326/57 |

* cited by examiner

*Primary Examiner*—Dinh T. Le
(74) *Attorney, Agent, or Firm*—Monica H. Choi

(57) ABSTRACT

For supplying voltage to at least one main current consuming unit, a voltage supply unit provides the voltage to the at least one main current consuming unit at a supply node. In addition, an auxiliary current consuming unit conducts auxiliary current from/to the supply node for at least a predetermined time period before the at least one main current consuming unit begins to conduct current. Thus, voltage overshoot is prevented at the supply node.

21 Claims, 6 Drawing Sheets

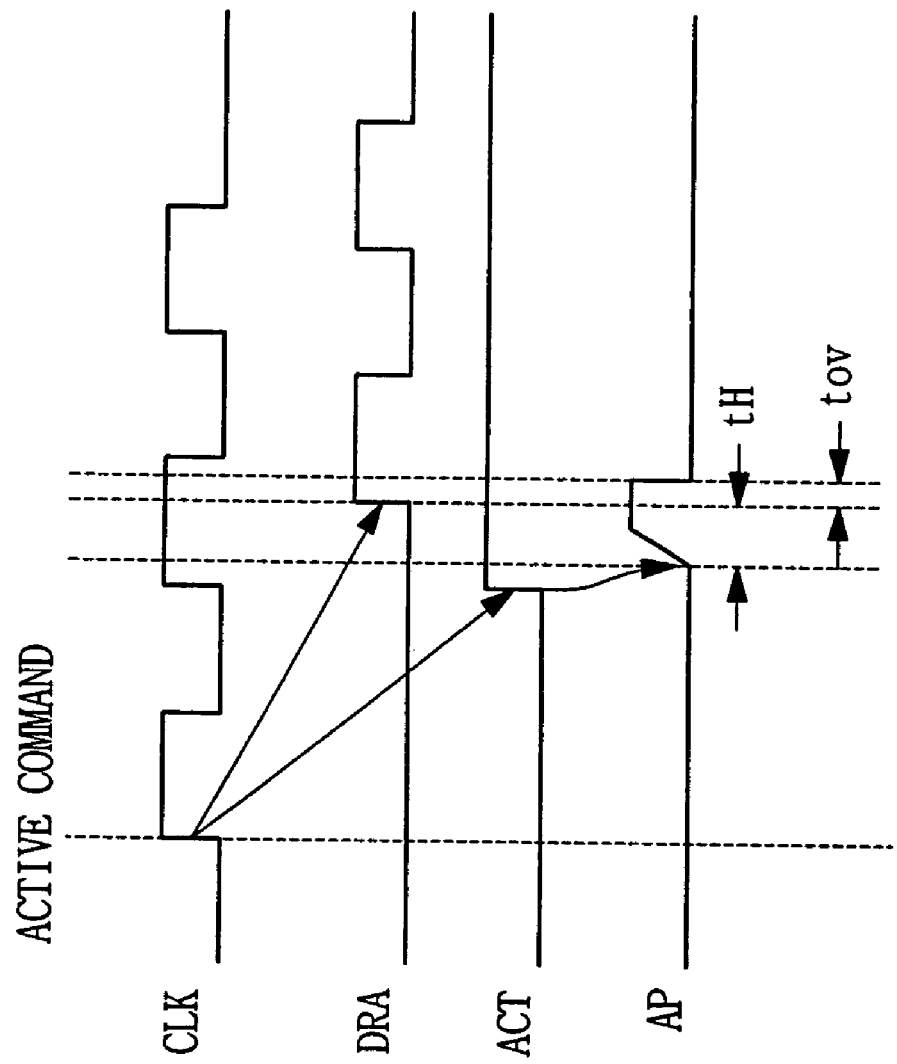

APPARATUS AND METHOD FOR SUPPLYING VOLTAGE IN SEMICONDUCTOR DEVICE

This application claims priority to Korean Patent Application No. 2006-03831, filed on Jan. 13, 2006 in the Korean Intellectual Property Office, the disclosure of which is incorporated herein in its entirety by reference.

BACKGROUND OF THE INVENTION

1. Field of the Invention

The present invention relates generally to supplying voltage in a semiconductor device, and more particularly, to conducting an auxiliary current at a supply node to prevent a voltage spike at the supply node for supplying a stable voltage.

2. Description of the Related Art

In general, an electronic device operates with a voltage externally supplied as a power source. In particular, a semiconductor device includes internal voltage generators that generate internal voltages that are each higher or lower than the externally provided voltage to perform operations. For example, a semiconductor memory device generates write/read voltages from an externally supplied voltage for performing write/read operations.

FIG. 1 illustrates a conventional voltage supply apparatus 100 for supplying a voltage to a plurality of current consuming units 120-1, 120-2, and 120-3. The voltage supply apparatus 100 includes a voltage supply unit 110 and a power capacitor 130. The voltage supply apparatus 100 may be formed within a semiconductor device.

The voltage supply unit 110 may be a pad having the voltage applied thereon from an external source. Alternatively, the voltage supply unit 110 may be a voltage generator for generating an internal voltage for operation of the current consuming units 120-1, 120-2, and 120-3. The current consuming units 120-1, 120-2, and 120-3 are internal circuits performing internal operations of the semiconductor device.

The power capacitor 130 stores charge when the voltage supply unit 110 provides the voltage thereon. The current consuming units 120-1, 120-2, and 120-3 consume such charge from the power capacitor 130.

The voltage supply unit 110 ideally supplies sufficient current consumed by the current consuming units 120-1, 120-2, and 120-3 for operation. In addition, the voltage supply unit 110 ideally supplies a uniform and stable voltage level. However, when the current consuming units 120-1, 120-2, and 120-3 begin to consume a large quantity of current, the level of voltage supplied from the voltage supply unit 110 is lowered to result in a voltage drop. Such a voltage drop may deteriorate the performance of the semiconductor device especially for high speed operation.

To prevent such a voltage drop, U.S. Pat. No. 6,504,783 to Jo discloses over-driving a driver of an internal voltage generator before an operating time point of current consumption. However, the internal voltage generator may provide excess current before such an operating time point to result in voltage overshoot which may also deteriorate the performance of the semiconductor device.

Alternatively, the voltage drop at the voltage supply unit 110 may be minimized by increasing the capacitance of the power capacitor 130. However, such increase of the power capacitance 130 undesirably results in increased size of the semiconductor device.

SUMMARY OF THE INVENTION

Accordingly, the present invention conducts an auxiliary current from/to a supply node to prevent voltage overshoot.

For supplying voltage to at least one main current consuming unit according to an aspect of the present invention, a voltage supply unit provides the voltage to the at least one main current consuming unit at a supply node. In addition, an auxiliary current consuming unit conducts auxiliary current from/to the supply node for at least a predetermined time period before the at least one main current consuming unit begins to conduct current.

In one example embodiment of the present invention, the auxiliary current is conducted away from the supply node for the predetermined time period when the voltage is a positive voltage.

In another embodiment of the present invention, a level of the auxiliary current is less than a level of the current conducted by the at least one main current consuming unit after the predetermined time period.

In a further embodiment of the present invention, the auxiliary current is conducted from/to the supply node for an overlap time period after the at least one main current consuming unit begins to conduct current. In that case, the auxiliary current consuming unit stops conducting the auxiliary current after the overlap time period.

In an example embodiment of the present invention, the voltage supply unit is a pad having applied thereon the voltage that is provided from an external source. Alternatively, the voltage supply unit is a voltage generator for internally generating the voltage.

In another example embodiment of the present invention, the auxiliary current consuming unit includes a switching device and a control signal generator. The switching device is coupled between the supply node and a low voltage node. The control signal generator activates a control signal applied on the switching device for turning on the switching device to conduct the auxiliary current.

In a further example embodiment of the present invention, the auxiliary current consuming unit further includes a resistor coupled between the switching device and the low voltage node that is a ground node. The resistance of the resistor limits a level of the auxiliary current. For example, the switching device is an NMOSFET (N-channel metal oxide semiconductor field effect transistor) having a drain coupled to the supply node, having a gate with the control signal applied thereon, and having a source coupled to the resistor.

In another example embodiment of the present invention, the control signal generator includes an AND-gate and a chain of an odd-number of inverters. The AND-gate has an indication signal as a first input, and an output of the AND-gate is the control signal. The chain of the inverters inputs the indication signal to generate a delayed indication signal that is a second input to the AND-gate, The present invention may be used to particular advantage when the voltage supply unit is a pad having a data power voltage externally applied thereon. In that case, the at least one main current consuming unit is at least one data output buffer, and the auxiliary current consuming unit conducts the auxiliary current in response to an output buffer enable signal being activated.

The present invention may also be used to particular advantage when the voltage supply unit is a boosted voltage generator. In that case, the at least one main current consuming unit is at least one word line driver, and the auxiliary current consuming unit conducts the auxiliary current in response to an active signal being activated.

In this manner, the auxiliary current conducted from the supply node prevents a voltage overshoot at the supply node before the main current consuming units begin to conduct current. Thus, a stable voltage is generated at the supply node.

BRIEF DESCRIPTION OF THE DRAWINGS

The above and other features and advantages of the present invention will become more apparent when described in detailed exemplary embodiments thereof with reference to the attached drawings in which:

FIG. 6 illustrates a timing diagram of signals during operation of the boosted voltage supply apparatus of FIG. 5, according to an example embodiment of the present invention.

The figures referred to herein are drawn for clarity of illustration and are not necessarily drawn to scale. Elements having the same reference number in FIGS. 1, 2, 3, 4, 5, and 6 refer to elements having similar structure and/or function.

DETAILED DESCRIPTION OF THE INVENTION

Figure 1:
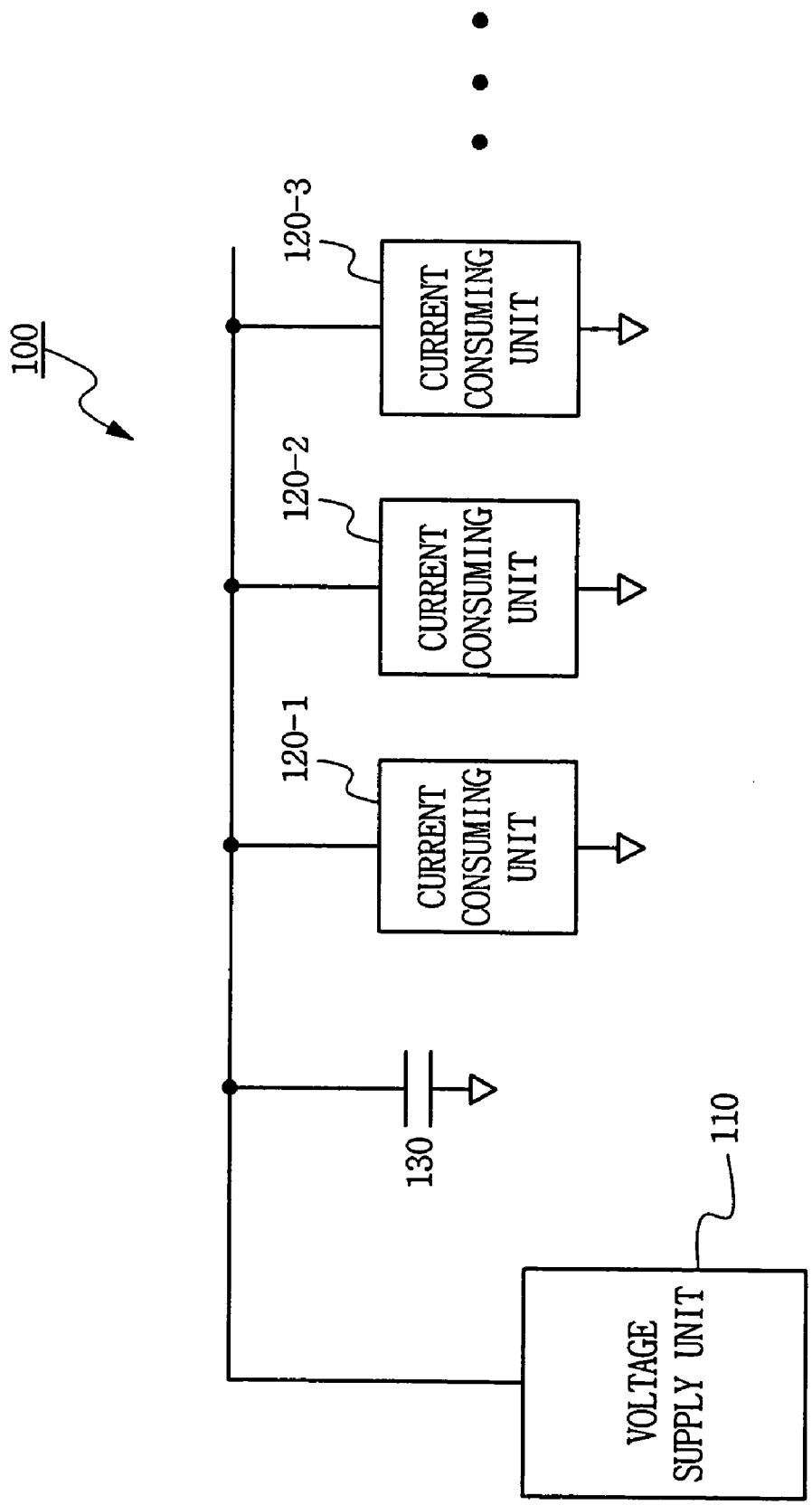
FIG. 1 illustrates a conventional voltage supply apparatus.
Figure 2:
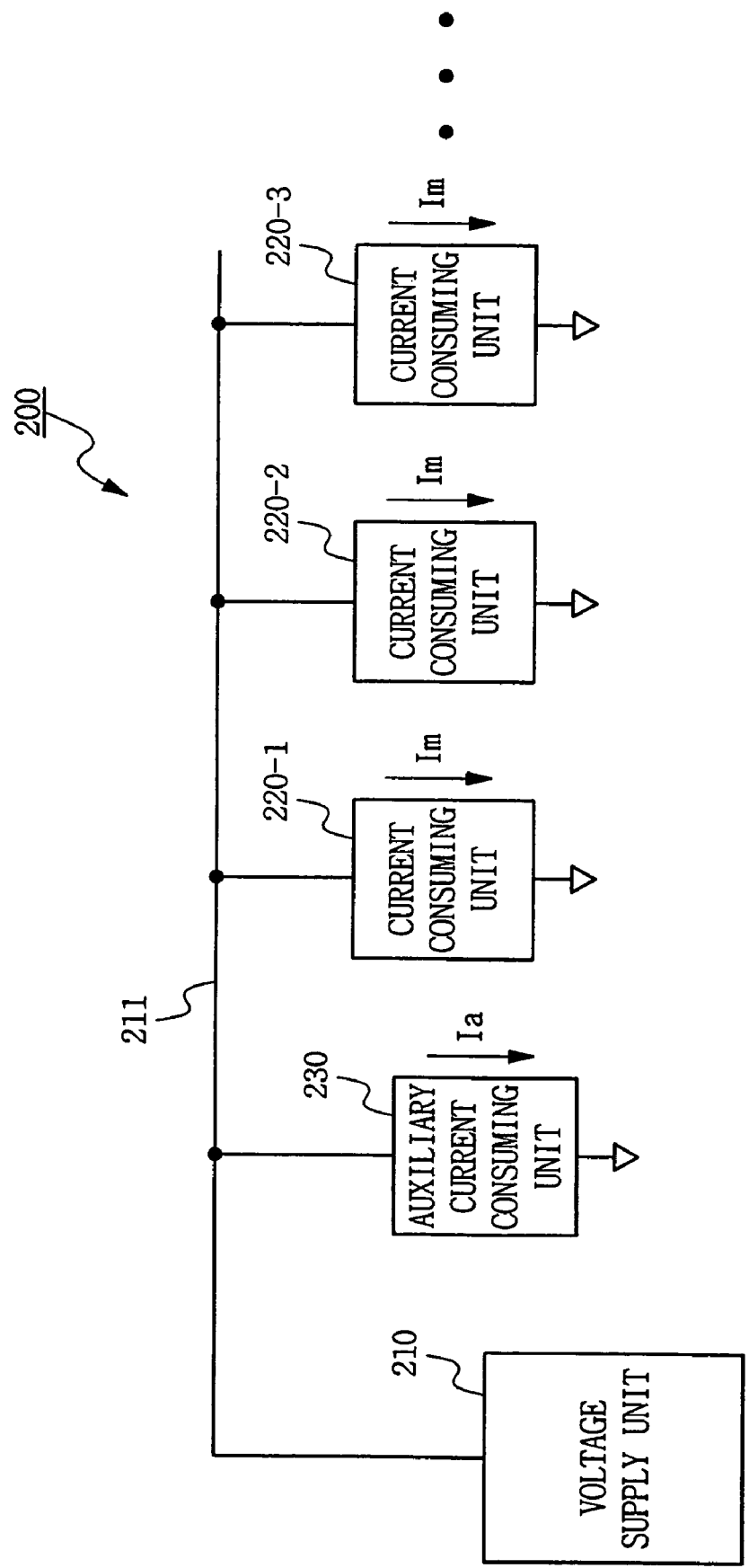
FIG. 2 illustrates a voltage supply apparatus according to an example embodiment of the present invention.

FIG. 2 shows a block diagram of a voltage supply apparatus for supplying a voltage within a semiconductor device 200 according to an embodiment of the present invention. The voltage supply apparatus includes a voltage supply unit 210 and an auxiliary current consuming unit 230, both coupled to a supply node 211.

The voltage supply apparatus of FIG. 2 provides a voltage applied at the supply node 211. A plurality of main current consuming units 220-1, 220-2, and 220-3 of the semiconductor device 200 are coupled to the supply node 211. The main current consuming units 220-1, 220-2, and 220-3 are components for performing typical operations of the semiconductor device 200. Each of the main current consuming units 220-1, 220-2, and 220-3 consumes a respective main current Im during such operation.

The voltage supply unit 210 is a pad having the voltage supplied from an external circuit applied thereon, in one example embodiment of the present invention. Alternatively, the voltage supply unit 210 is an internal voltage generator fabricated within the semiconductor device 200 to generate an internal voltage applied at the supply node 211.

The auxiliary current consuming unit 230 conducts an auxiliary current Ia for a predetermined time period before any of the main current consuming units 220-1, 220-2, and 220-3 conducts the main current Im. In one embodiment of the present invention, the auxiliary current Ia is conducted away from the supply node 211 to a low voltage node such as a ground node when a positive voltage is generated at the supply node 211. The ground node may also be a reference ground node for the voltage supply unit 210.

In a further embodiment of the present invention, the level of the auxiliary current Ia is less than each main current Im. In another embodiment of the present invention, the auxiliary current Ia is cut off after any of the main current consuming units 220-1, 220-2, and 220-3 conducts the main current Im.

Figure 3:
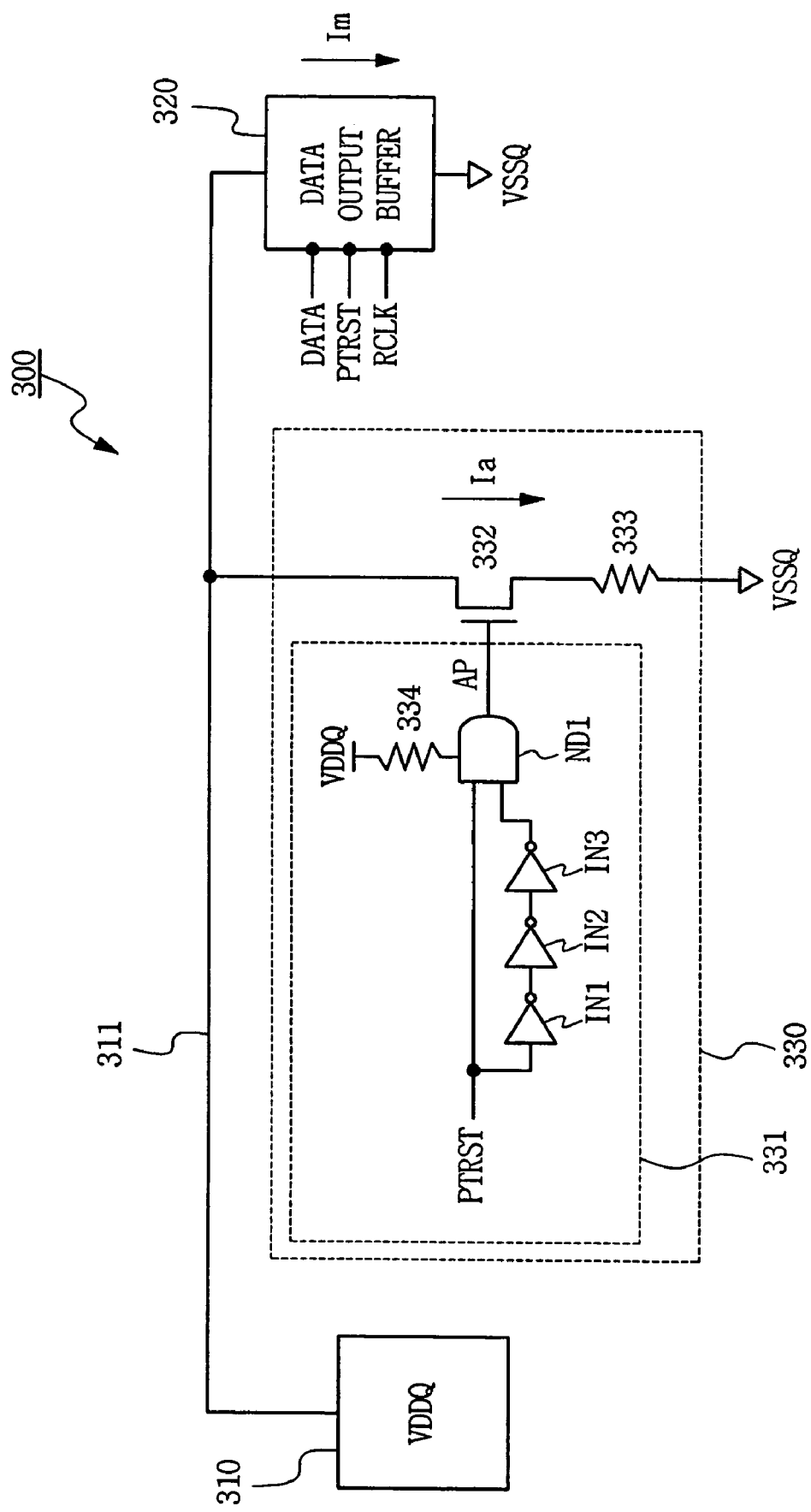
FIG. 3 is a block diagram of a data power supply apparatus within a semiconductor device, according to an example embodiment of the present invention.

FIG. 3 shows such an example data power supply apparatus 300 for transferring a data power voltage VDDQ to at least one data output buffer 320. In that case, the voltage supply apparatus 300 includes a voltage supply unit 310 that is a VDDQ pad of the semiconductor device of FIG. 3. The VDDQ pad 310 has applied thereon the data power voltage externally generated by an external device. In addition, the voltage supply apparatus 300 includes an auxiliary current consuming unit 330. The VDDQ pad 310, the data output buffer 320, and the auxiliary current consuming unit 330 are coupled to a supply node 311.

The data output buffer 320 outputs data DATA stored in a memory cell (not shown in FIG. 3) to an external device, in response to an output buffer enable signal PTRST and synchronized to an output clock RCLK. The output buffer enable signal PTRST is generated in response to a read command.

When such data DATA is output using the data power voltage VDDQ on the supply node 311, the data output buffer 320 consumes a main current Im from the supply node 311 to a data reference voltage VSSQ (such as a ground node for example). Although only one data output buffer 320 is shown in FIG. 3 for clarity and simplicity of illustration and description, a semiconductor device typically includes a plurality of data output buffers to output data with one read command.

The auxiliary current consuming unit 330 includes a control signal generator 331, a switch device 332, and a resistor 333. In one example embodiment of the present invention, the switch device 332 is an NMOSFET (N-channel metal oxide semiconductor field effect transistor) having a drain coupled to the supply node 311, having a gate coupled to the control signal generator 331, and having a source coupled to the resistor 333. The resistor 333 is coupled between the source of the NMOSFET 332 and the low voltage node VSSQ such as the ground node.

The control signal generator 331 includes an AND-gate generating a control signal AP applied on the gate of the NMOSFET 332. The output buffer enable signal PTRST is a first input to the AND-gate ND1. In addition, the control signal generator 331 includes a chain of an odd-number of inverters IN1, IN2, and IN3 that inputs the output buffer enable signal PTRST to generate a delayed and inverted output buffer enable signal as a second input to the AND-gate ND1. Another resistor 334 is coupled between a high power supply which may be the VDDQ at the supply node 311 and the AND-gate ND1.

Figure 4:
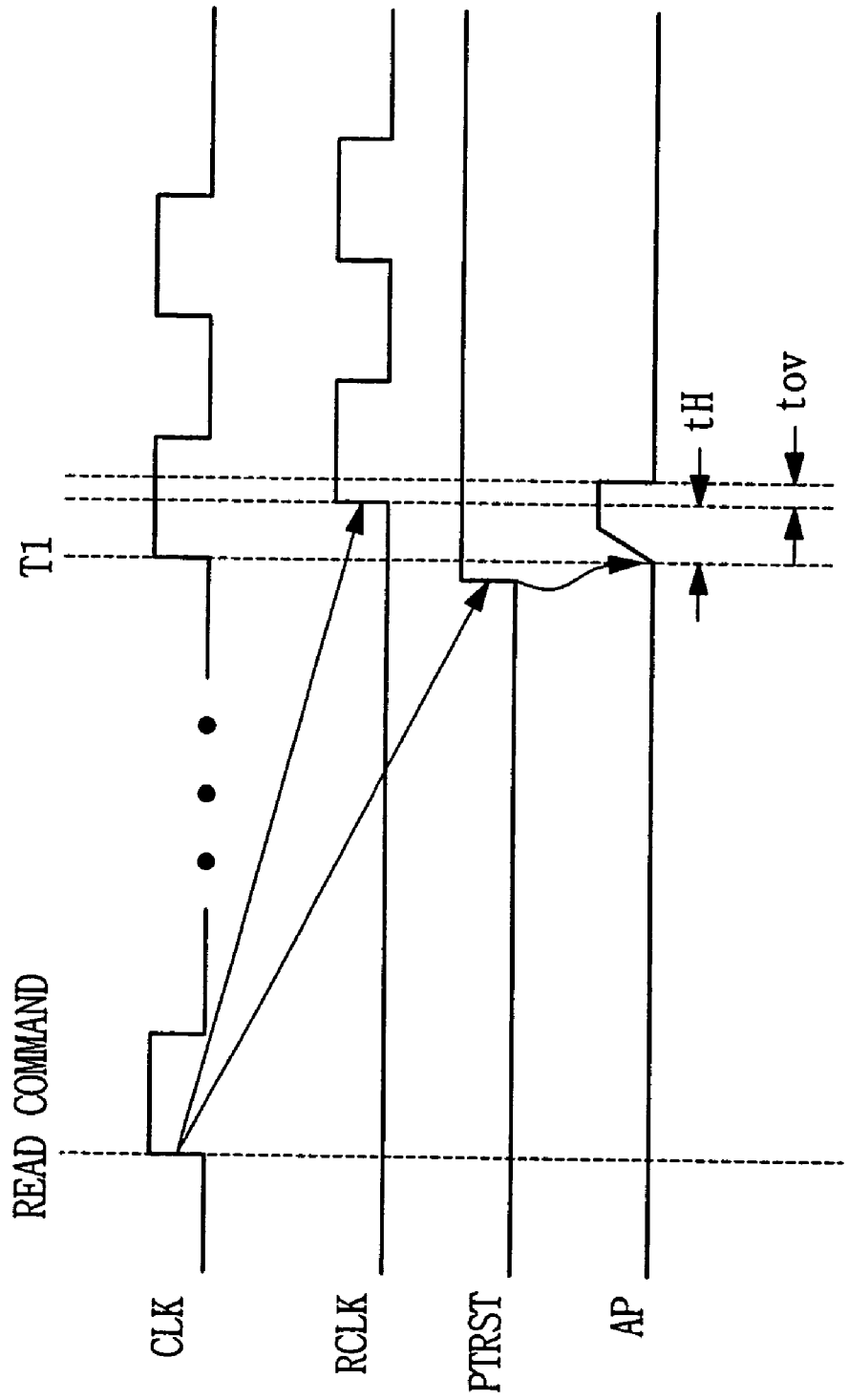
FIG. 4 illustrates a timing diagram of signals during operation of the data power supply apparatus of FIG. 3, according to an example embodiment of the present invention.

FIG. 4 illustrates a timing diagram of signals during operation of the data power supply apparatus of FIG. 3, according to an example embodiment of the present invention. Referring to FIGS. 3 and 4, after a READ command is received synchronized to a clock signal CLK by the semiconductor device of FIG. 3, the output buffer enable signal PTRST is activated to a logical high state at a time point T1.

At such a time point T1, the AND gate ND1 initially has the logic high state of the output buffer enable signal PTRST as the first input, and a logic high state of the output of the inverter IN3 as the second input. Thus, the control signal AP is activated by being ramped to the logic high state from the logic low state. The resistance of the resistor 334 determines a rise time, tH, of the control signal AP to the logic high state.

Eventually, the logic high state of the output buffer enable signal PTRST is transmitted through the inverters IN1, IN2, and IN3 such that the inverter IN3 outputs a logic low state at which point the control signal AP transitions back down to the logic low state. In this manner, the control signal AP is formed as an activated pulse after the output buffer enable signal PTRST is activated to the logic high state. The duration of the pulse of the control signal AP may be adjusted by controlling the delay of each of the inverters IN1, IN2, and IN3.

During such an activated pulse of the control signal AP, the NMOSFET 332 is turned on to conduct the auxiliary current Ia away from the supply node 311 to the low voltage node VDDS when the data power voltage VDDQ is a positive voltage. The resistance of the resistor 333 limits the level of the auxiliary current Ia when the NMOSFET 332 is turned on. When the control signal AP is deactivated, the NMOSFET 332 is turned off to cut-off the auxiliary current Ia.

A read reference clock RCLK is generated using the clock signal CLK in response to the activation of the output buffer enable signal PTRST. The data output buffer 320 outputs data transmitted from a memory cell in response to the read reference clock RCLK. For example referring to FIGS. 3 and 4, the data output buffer 320 begins to conduct a main current Im at a first rising edge of the RCLK signal after activation of the output buffer enable signal PTRST.

In one embodiment of the present invention, the delays through the inverters IN1, IN2, and IN3 are controlled such that the control signal AP is deactivated an overlap time tov after such first rising edge of the RCLK signal after activation of the output buffer enable signal PTRST. In that case, the auxiliary current consuming unit 330 conducts the auxiliary current Ia, and the data output buffer 320 conducts the main current Im, simultaneously during the overlap time period tov. Such an overlap maintains continuity in current consumption from the supply node 311. In one embodiment of the present invention, the level of the auxiliary current Ia is less than the level of the main current Im.

In this manner, the auxiliary current consuming unit 330 conducts the auxiliary current Ia for a predetermined time period before the data output buffer 320 (i.e. a main current consuming unit) conducts the main current Im. In addition, the auxiliary current consuming unit 330 also conducts the auxiliary current Ia for the overlap time period tov after the data output buffer 320 conducts the main current Im. The auxiliary current 1*a* is cut off after the overlap time period tov. Such auxiliary current Ia conducted away from the supply node 311 prevents overshoot of the voltage generated at the supply node 311.

Figure 5:
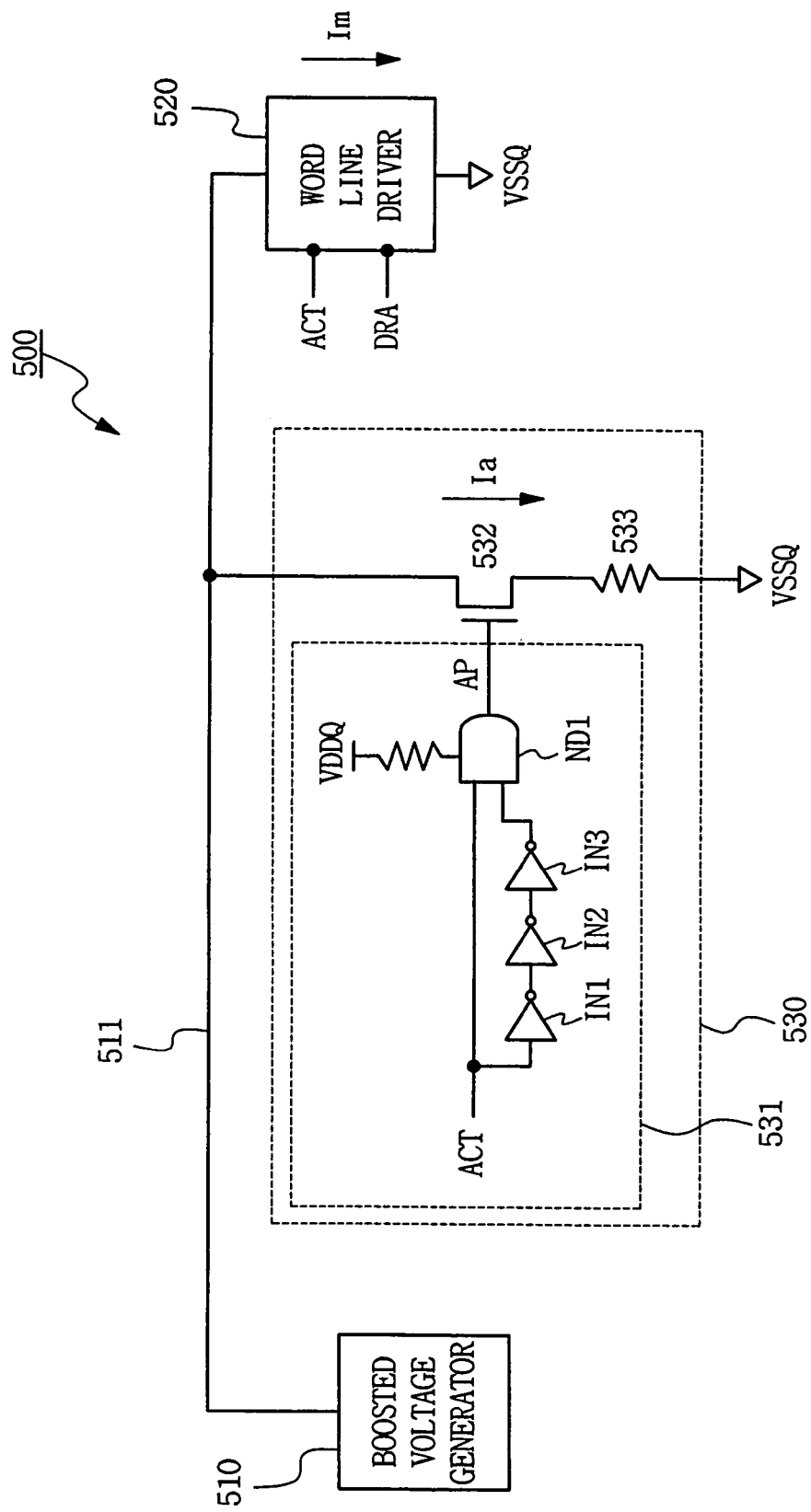
FIG. 5 is a block diagram of a boosted voltage supply apparatus within a semiconductor device, according to another example embodiment of the present invention.

In another embodiment of the present invention, FIG. 5 shows a boosted voltage supply apparatus 500. The boosted voltage supply apparatus 500 is formed within a semiconductor memory device having a word line driver 520 for driving a word line of the memory device.

The boosted voltage supply apparatus 500 includes a boosted voltage generator 510 and an auxiliary current consuming unit 530. The boosted voltage generator 510 is an internal circuit of the semiconductor memory device for generating a boosted voltage VPP from an externally supplied voltage.

The boosted voltage VPP is applied at a supply node 511. The boosted voltage generator 510, the auxiliary current consuming unit 530, and the word line driver 520 of the memory device are coupled to the supply node 511. The word line driver 520 drives a word line of the semiconductor memory device using the boosted voltage VPP at the supply node 511.

The auxiliary current consuming unit 530 includes a switch device 532, a resistor 533, and a control signal generator 531 that operate similarly as the components 332, 333, and 331, respectively, of FIG. 3. In addition, the control signal generator 531 includes an AND gate ND1 and inverters IN1, IN2, and IN3 that operate similarly with the same referenced components of FIG. 3.

FIG. 6 illustrates a timing diagram of signals during operation of the boosted voltage supply apparatus 500 of FIG. 5, according to an example embodiment of the present invention. The word line driver 520 drives a word line of the semiconductor memory device with the boosted voltage VPP on the supply node 511 in response to an active signal ACT and a decoded address signal DRA.

The active signal ACT is activated in response to an active command that is issued in synchronization with a clock signal CLK. In addition, decoded address signal DRA is generated from the clock signal CLK after activation of the ACT signal. In this manner, the control signal AP is generated as a pulse after the activation of the active signal ACT and until the overlap time period tov after the first rising edge of the DRA signal.

Thus, similarly as described in reference to FIGS. 3 and 4, the auxiliary current consuming unit 530 in the boosted voltage supply apparatus 500 of FIG. 5 conducts the auxiliary current Ia for a predetermined time period before the word line driver 520 (i.e. a main current consuming unit) conducts the main current Im. In addition, the auxiliary current consuming unit 530 also conducts the auxiliary current Ia for the overlap time period tov after the word line driver 520 conducts the main current Im. The auxiliary current 1*a* is cut off after the overlap time period tov. Such auxiliary current 1*a* conducted away from the supply node 511 prevents overshoot of the voltage generated at the supply node 511.

The foregoing is by way of example only and is not intended to be limiting. For example, any numbers or number of elements described and illustrated herein is by way of example only. In addition, the auxiliary current consuming units 330 and 530 of FIGS. 3 and 5 may be applied in other types of semiconductor devices with other types of main current consuming units. Thus, the output buffer enable signal PTRST and the active signal ACT in FIGS. 3 and 5 are just example indication signals for generating the control signal AP.

The present invention is limited only as defined in the following claims and equivalents thereof.

What is claimed is:

1. An apparatus for supplying voltage to at least one main current consuming unit, the apparatus comprising:
    a voltage supply unit for providing the voltage to the at least one main current consuming unit at a supply node; and
    an auxiliary current consuming unit for conducting auxiliary current from/to the supply node for at least a predetermined time period before the at least one main current consuming unit begins to conduct any of a main current,
    wherein the voltage supply unit, the at least one main current consuming unit, and the auxiliary current consuming unit are each directly connected to the supply node having the voltage from the voltage supply unit directly applied thereon,
    and wherein the auxiliary current consuming unit begins to conduct the auxiliary current in response to a first signal, and wherein the main current consuming unit begins to conduct the main current in response to a second signal that is separate from the first signal.

2. The apparatus of claim 1, wherein the auxiliary current is conducted away from the supply node for the predetermined time period when the voltage is a positive voltage.

3. The apparatus of claim 1, wherein a level of the auxiliary current is less than a level of the main current conducted by the at least one main current consuming unit after the predetermined time period.

4. The apparatus of claim 1, wherein the auxiliary current is conducted from/to the supply node for an overlap time period after the at least one main current consuming unit begins to conduct the main current in addition to the auxiliary current consuming unit conducting the auxiliary current from/to the supply node for at least the predetermined time period before the at least one main current consuming unit begins to conduct the main current.

5. The apparatus of claim 4, wherein the auxiliary current consuming unit stops conducting the auxiliary current after the overlap time period.

6. The apparatus of claim 1, wherein the apparatus is formed within a semiconductor device, and wherein the voltage supply unit is a pad having applied thereon the voltage that is provided from an external source.

7. The apparatus of claim 1, wherein the apparatus is formed within a semiconductor device, and wherein the voltage supply unit is a voltage generator formed within the semiconductor device.

8. The apparatus of claim 1, wherein a plurality of main current consuming units are coupled to the supply node, and wherein the auxiliary current consuming unit conducts the auxiliary current for the predetermined time period before any of the plurality of main current consuming units begins to conduct the main current.

9. The apparatus of claim 1, wherein the auxiliary current consuming unit includes:
a switching device coupled between the supply node and a low voltage node; and
a control signal generator that activates a control signal applied on the switching device for turning on the switching device to conduct the auxiliary current.

10. The apparatus of claim 9, wherein the auxiliary current consuming unit further includes:
a resistor coupled between the switching device and the low voltage node that is a ground node, wherein the resistance of the resistor limits a level of the auxiliary current.

11. The apparatus of claim 10, wherein the switching device is an NMOSFET (N-channel metal oxide semiconductor field effect transistor) having a drain coupled to the supply node, having a gate with the control signal applied thereon, and having a source coupled to the resistor.

12. An apparatus for supplying voltage to at least one main current consuming unit, the apparatus comprising:
a voltage supply unit for providing the voltage to the at least one main current consuming unit at a supply node; and
an auxiliary current consuming unit for conducting auxiliary current from/to the supply node for at least a predetermined time period before the at least one main current consuming unit begins to conduct any of a main current,
wherein the auxiliary current consuming unit begins to conduct the auxiliary current in response to a first signal, and wherein the main current consuming unit begins to conduct the main current in response to a second signal that is separate from the first signal;
and wherein the auxiliary current consuming unit includes:
a switching device coupled between the supply node and a low voltage node; and
a control signal generator that activates a control signal applied on the switching device for turning on the switching device to conduct the auxiliary current;
and wherein the control signal generator includes:
an AND-gate having an indication signal as a first input; and
a chain of an odd-number of inverters inputting the indication signal to generate a delayed indication signal that is a second input to the AND-gate,
wherein an output of the AND-gate is the control signal.

13. The apparatus of claim 12, wherein the control signal generator further includes:
a resistor coupled between a high voltage supply and the AND-gate, wherein a resistance of the resistor determines a rise time during activation of the control signal.

14. The apparatus of claim 1, wherein the voltage supply unit is a pad having a data power voltage externally applied thereon, and wherein the at least one main current consuming unit is at least one data output buffer, and wherein the auxiliary current consuming unit conducts the auxiliary current in response to an output buffer enable signal being activated.

15. The apparatus of claim 1, wherein the voltage supply unit is a boosted voltage generator, and wherein the at least one main current consuming unit is at least one word line driver, and wherein the auxiliary current consuming unit conducts the auxiliary current in response to an active signal being activated.

16. A method for supplying voltage to at least one main current consuming unit, the method comprising:
providing the voltage from a voltage supply unit to the at least one main current consuming unit at a supply node; and
conducting auxiliary current from/to the supply node for at least a predetermined time period before the at least one main current consuming unit begins to conduct any of a main current,
wherein an auxiliary current consuming unit generates the auxiliary current;
and wherein the voltage supply unit, the at least one main current consuming unit, and the auxiliary current consuming unit are each directly connected to the supply node having the voltage from the voltage supply unit directly applied thereon,
and wherein the auxiliary current consuming unit begins to conduct the auxiliary current in response to a first signal, and wherein the main current consuming unit begins to conduct the main current in response to a second signal that is separate from the first signal.

17. The method of claim 16, wherein a level of the auxiliary current is less than a level of the main current conducted by the at least one main current consuming unit after the predetermined time period.

18. The method of claim 16, further comprising:
conducting the auxiliary current from/to the supply node for an overlap time period after the at least one main current consuming unit begins to conduct the main current in addition to the auxiliary current consuming unit conducting the auxiliary current from/to the supply node for at least the predetermined time period before the at least one main current consuming unit begins to conduct the main current.

19. The method of claim 18, further comprising:
stopping conduction of the auxiliary current after the overlap time period.

20. The method of claim 16, wherein the voltage is an externally supplied data power voltage, and wherein the at least one main current consuming unit is at least one data output buffer, and wherein the auxiliary current is conducted in response to an output buffer enable signal being activated.

21. The method of claim 16, wherein the voltage is an internally generated boosted voltage, and wherein the at least one main current consuming unit is at least one word line driver, and wherein the auxiliary current is conducted in response to an active signal being activated.

* * * * *